United States Patent
Avrutsky

(10) Patent No.: US 9,324,885 B2
(45) Date of Patent: Apr. 26, 2016

(54) SYSTEMS AND METHODS TO PROVIDE ENHANCED DIODE BYPASS PATHS

(75) Inventor: Mordechay Avrutsky, Alfei Menashe (IL)

(73) Assignee: TIGO ENERGY, INC., Los Gatos, CA (US)

( * ) Notice: Subject to any disclaimer, the term of this patent is extended or adjusted under 35 U.S.C. 154(b) by 1022 days.

(21) Appl. No.: 12/724,371

(22) Filed: Mar. 15, 2010

(65) Prior Publication Data

US 2011/0079263 A1    Apr. 7, 2011

Related U.S. Application Data

(60) Provisional application No. 61/278,217, filed on Oct. 2, 2009.

(51) Int. Cl.
| | | |
|---|---|---|
| *H01L 31/044* | (2014.01) | |
| *H01L 31/02* | (2006.01) | |
| *H03K 5/08* | (2006.01) | |
| *H02S 40/34* | (2014.01) | |

(52) U.S. Cl.
CPC .......... *H01L 31/02021* (2013.01); *H02S 40/34* (2014.12); *H03K 5/08* (2013.01); *Y02E 10/50* (2013.01)

(58) Field of Classification Search
USPC ......... 136/244–265; 320/61, 1; 323/906, 284, 323/285
See application file for complete search history.

(56) References Cited

U.S. PATENT DOCUMENTS

| | | | |
|---|---|---|---|
| 5,196,781 A * | 3/1993 | Jamieson et al. | ............. 320/102 |
| 5,235,266 A | 8/1993 | Schaffrin | |
| 5,268,832 A | 12/1993 | Kandatsu | |
| 5,604,430 A | 2/1997 | Decker et al. | |
| 5,923,158 A | 7/1999 | Kurokami et al. | |
| 6,275,016 B1 | 8/2001 | Ivanov | |
| 6,429,632 B1 | 8/2002 | Forbes et al. | |
| 6,448,489 B2 | 9/2002 | Kimura et al. | |
| 6,650,031 B1 | 11/2003 | Goldack | |
| 6,724,593 B1 | 4/2004 | Smith | |
| 6,844,739 B2 | 1/2005 | Kasai et al. | |
| 6,894,911 B2 | 5/2005 | Telefus et al. | |

(Continued)

FOREIGN PATENT DOCUMENTS

| | | |
|---|---|---|
| AU | 2005262278 | 7/2005 |
| DE | 4232356 | 3/1994 |

(Continued)

OTHER PUBLICATIONS

Lowe, http://www.dummies.com/how-to/content/electronics-basics-what-is-a-lath-circuit.html, downloaded Jul. 13, 2014.*

(Continued)

*Primary Examiner* — Jayne Mershon
(74) *Attorney, Agent, or Firm* — Greenberg Traurig LLP

(57) ABSTRACT

Systems and methods are herein disclosed for efficiently allowing current to bypass a group of solar cells having one or more malfunctioning or shaded solar cells without overwhelming a bypass diode. This can be done using a switch (e.g., a MOSFET) connected in parallel with the bypass diode. By turning the switch on and off, a majority of the bypass current can be routed through the switch, which is configured to handle larger currents than the bypass diode is designed for, leaving only a minority of the current to pass through the bypass diode.

11 Claims, 6 Drawing Sheets

(56) References Cited

U.S. PATENT DOCUMENTS

| | | | |
|---|---|---|---|
| 6,984,970 | B2 | 1/2006 | Capel |
| 7,061,214 | B2 | 6/2006 | Mayega |
| 7,248,946 | B2 | 7/2007 | Bashaw et al. |
| 7,256,566 | B2 | 8/2007 | Bhavaraju et al. |
| 7,276,886 | B2 | 10/2007 | Kinder |
| 7,518,346 | B2 | 4/2009 | Prexl |
| 7,595,616 | B2 | 9/2009 | Prexl |
| 7,605,498 | B2 | 10/2009 | Ledenev et al. |
| 7,719,140 | B2 | 5/2010 | Ledenev et al. |
| 7,808,125 | B1 | 10/2010 | Sachdeva et al. |
| 7,919,953 | B2 | 4/2011 | Porter et al. |
| 8,378,656 | B2 | 2/2013 | de Rooij et al. |
| 8,618,864 | B2 | 12/2013 | Robbins |
| 8,779,632 | B2 | 7/2014 | Freyermuth |
| 2005/0057214 | A1 | 3/2005 | Matan |
| 2005/0057215 | A1 | 3/2005 | Matan |
| 2006/0001406 | A1 | 1/2006 | Matan |
| 2006/0162772 | A1* | 7/2006 | Presher et al. ............. 136/290 |
| 2006/0174939 | A1 | 8/2006 | Matan |
| 2006/0185727 | A1 | 8/2006 | Matan |
| 2006/0232324 | A1 | 10/2006 | Huang et al. |
| 2006/0261751 | A1* | 11/2006 | Okabe et al. ............. 315/291 |
| 2007/0273351 | A1 | 11/2007 | Matan |
| 2008/0111529 | A1* | 5/2008 | Shah et al. ............. 323/283 |
| 2008/0121272 | A1 | 5/2008 | Besser et al. |
| 2008/0122449 | A1 | 5/2008 | Besser et al. |
| 2008/0122518 | A1 | 5/2008 | Besser et al. |
| 2008/0179949 | A1 | 7/2008 | Besser et al. |
| 2008/0191560 | A1 | 8/2008 | Besser et al. |
| 2008/0191675 | A1 | 8/2008 | Besser et al. |
| 2008/0198523 | A1 | 8/2008 | Schmidt et al. |
| 2008/0258839 | A1 | 10/2008 | Uejima et al. |
| 2008/0303503 | A1 | 12/2008 | Wolfs |
| 2009/0014050 | A1 | 1/2009 | Haaf |
| 2009/0140715 | A1 | 6/2009 | Adest et al. |
| 2009/0184746 | A1* | 7/2009 | Fahrenbruch ............. 327/427 |
| 2009/0195081 | A1* | 8/2009 | Quardt et al. ............. 307/125 |
| 2009/0278496 | A1 | 11/2009 | Nakao et al. |
| 2010/0002349 | A1 | 1/2010 | La Scala et al. |
| 2010/0066341 | A1 | 3/2010 | Watanabe et al. |
| 2010/0229915 | A1* | 9/2010 | Ledenev et al. ............. 136/244 |
| 2010/0244575 | A1 | 9/2010 | Coccia et al. |
| 2010/0288327 | A1 | 11/2010 | Lisi et al. |
| 2011/0006232 | A1 | 1/2011 | Fahrenbruch et al. |
| 2012/0199172 | A1 | 8/2012 | Avrutsky |

FOREIGN PATENT DOCUMENTS

| | | | |
|---|---|---|---|
| DE | 19961705 | | 7/2001 |
| EP | 1388774 | | 2/2004 |
| ES | 2249147 | | 3/2006 |
| WO | 2003012569 | | 2/2003 |
| WO | WO 2006/079503 | * | 8/2006 |

OTHER PUBLICATIONS

Alonso, R. et al., "A New Distributed Converter Interface for PV Panels," 20th European Photovoltaic Solar Energy Conference, Barcelona, Spain, pp. 2288-2291, Jun. 6-10, 2005.

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, the "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Euronsun 96, pp. 819-824, Sep. 16, 1996.

Roman, Eduardo, et al., "Intelligent PV Module for Grid-Connectred PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

* cited by examiner

SYSTEMS AND METHODS TO PROVIDE ENHANCED DIODE BYPASS PATHS

CROSS-REFERENCE TO RELATED APPLICATIONS

The present application claims the benefit of Provisional U.S. Application Ser. No. 61/278,217, filed Oct. 2, 2009, entitled "SYSTEM AND METHOD FOR HIGH-EFFICIENCY EMULATED DIODES," which is incorporated herein by reference.

FIELD OF THE TECHNOLOGY

At least some embodiments of the disclosure relate to limiting current in bypass diodes of a solar energy generating system.

BACKGROUND

Solar cells can be connected in series to form strings. When one or more solar cells in the string malfunction or are shaded from sunlight, the malfunctioning or shaded solar cells become highly resistive. As a result, other solar cells in the string may not generate enough voltage to overcome the resistive cells and thus current will cease to pass through the string. Bypass diodes can be connected in parallel with groups of solar cells (one or more solar cells connected in series) to allow current to bypass groups of solar cells having one or more highly resistive solar cell. In this way, current can continue to run through the string even when one or more solar cells malfunction or are shaded. However, large and efficient solar modules generate such large currents that when these large currents pass through the bypass diodes there are unwanted power losses and heat, and even bypass diode damage. Even low loss diodes (e.g., Schottky diodes) may not be able to overcome the losses, heat, and potential damage.

SUMMARY OF THE DESCRIPTION

Systems and methods to allow high currents to efficiently pass bypass diodes in solar modules are described herein. Some embodiments are summarized in this section.

Systems and methods are herein disclosed for efficiently allowing current, or a bypass current, to bypass a group of solar cells having one or more malfunctioning or shaded solar cells without overwhelming a bypass diode. This can be done using a switch (e.g., a metal-oxide semiconductor field-effect transistor) connected in parallel with the bypass diode. By turning the switch on, a majority of the bypass current can be routed through the switch, which is configured to handle larger currents than the bypass diode is designed for, and a minority of the current can be routed through the bypass diode.

A small amount of power from the bypass current can be used to power the switch and/or a controller configured to turn the switch on and off. A capacitor can be connected to a control of the switch (e.g., the gate of a metal-oxide semiconductor field-effect transistor) through a latch circuit. When the latch is closed or off, the capacitor cannot discharge and close, or turn on, the switch. When the latch is open or on, the capacitor can discharge and close, or turn on, the switch. The latch turns on when the capacitor voltage has been charged to above a first voltage threshold. With the switch turned on, a majority of the bypass current passes through the switch rather than through the bypass diode.

A current and voltage spike generated when the switch closes can be used to power the switches. As the capacitor discharges, the voltage across the capacitor decreases until the voltage falls below a second voltage threshold (the second voltage threshold is lower than the first voltage threshold). When this happens, the latch circuit turns off and prevents the capacitor from discharging. Without the capacitor voltage reaching the switch, the switch turns off. This causes a current and voltage spike through the bypass diode. A portion of this current and voltage spike can be used to recharge the capacitor until the voltage across the capacitor again rises above the first voltage threshold. The latch circuit then opens again, the switch turns on, and the cycle begins again.

In one embodiment, a system includes a group of series-connected solar cells, a bypass diode, and a bypass switch. The bypass diode can be connected in parallel to the group of series-connected solar cells. The bypass switch can be connected in parallel to the group of solar cells and the bypass diode. The bypass switch can be configured to allow a bypass current to bypass the group of solar cells and the bypass diode.

In another embodiment, a system includes one or more bypass diodes and one or more bypass transistors. The one or more bypass diodes can be connected in series with one another and connected in parallel with a group of series-connected solar cells. The one or more bypass transistors can be connected in parallel with the one or more bypass diodes. The one or more bypass transistors can be configured to turn on for a predetermined time period, in response to a bypass current passing through the one or more bypass diodes and to reroute the bypass current from the one or more bypass diodes to the one or more bypass transistors.

In another embodiment, a method includes charging a capacitor of a controller in response to a bypass current passing through a bypass diode. The method also includes opening a latch circuit of the controller when a voltage across a capacitor of the controller exceeds a first voltage threshold. The method also includes applying a portion of the voltage to gates of a pair of bi-directional MOSFETs to turn on bi-directional MOSFETs via the opening of the latch circuit. The bi-directional MOSFETs are connected to the diode to reduce the current passing through the diode when the bi-directional MOSFETs are turned on. The method also includes closing the latch circuit when the voltage across the capacitor falls below a second voltage threshold to turn off the bi-directional MOSFETs. The second voltage threshold can be lower than the first voltage threshold.

Other embodiments and features of the present invention will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Figure 1:
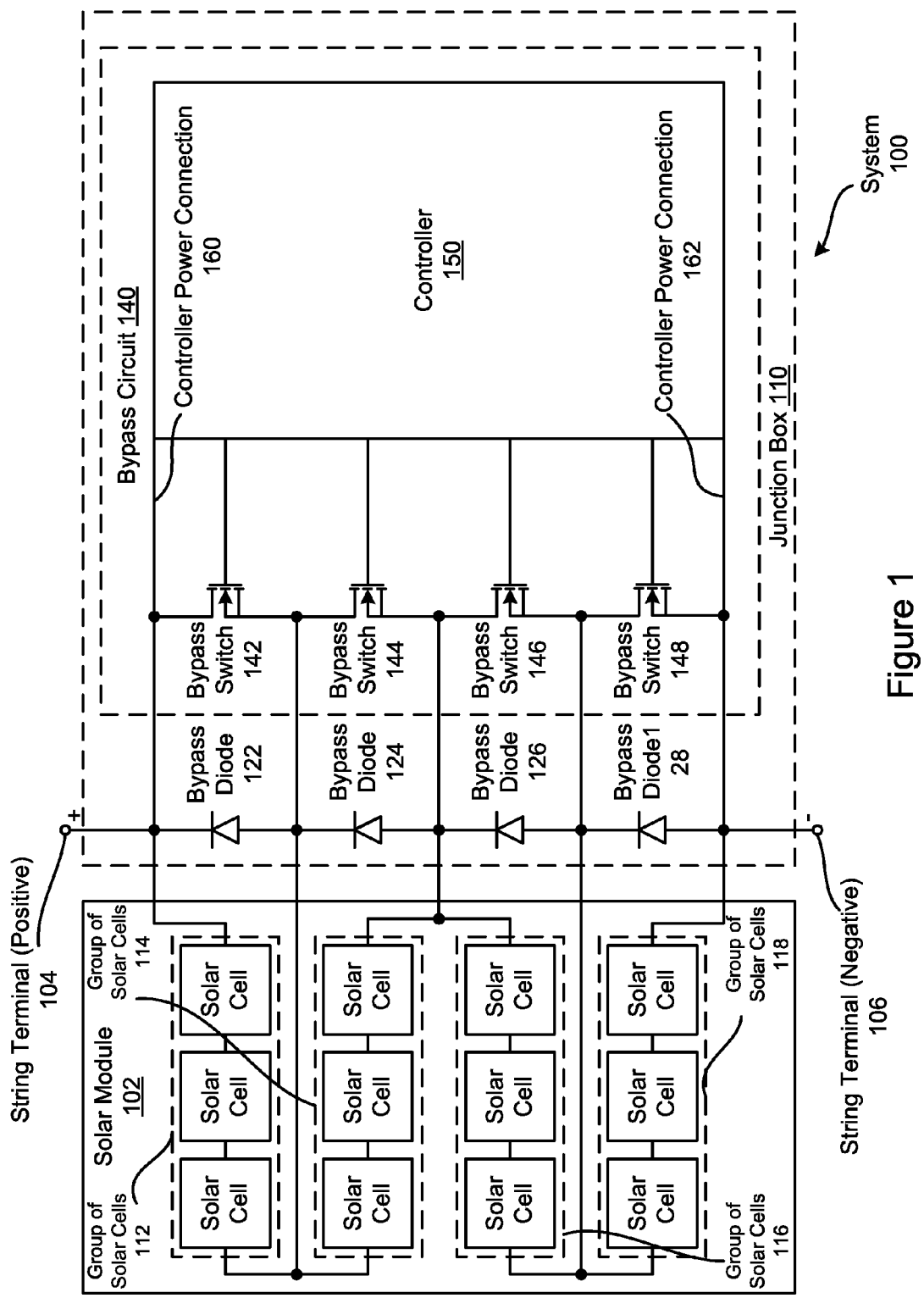
FIG. 1 illustrates an embodiment of switches connected in parallel to bypass diodes.

FIG. 1 illustrates an embodiment of switches connected in parallel to bypass diodes. The system 100 illustrated in FIG. 1 includes a solar module 102 having four groups of solar cells 112, 114, 116, 118. Each group of solar cells 112, 114, 116, 118 is connected in series with an adjacent group of solar cells 112, 114, 116, 118. The solar module 102 is part of a string of solar modules, and is series (or parallel) connected to other strings via the string terminals 104, 106. Each group of solar cells 112, 114, 116, 118 is connected in parallel with a bypass diode 122, 124, 126, 128. If a solar cell within any one of the groups of solar cells 112, 114, 116, 118 becomes too resistive, either due to malfunction, shading, or other causes, current passes through the bypass diode 122, 124, 126, 128 rather than the high resistance group of solar cells 112, 114, 116, 118. However, the bypass diodes 122, 124, 126, 128 are resistive enough that high currents passing through them can cause unwanted heat (lost power) and damage to the bypass diodes 122, 124, 126, 128. To avoid these losses and damage, bypass switches 142, 144, 146, 148 (e.g., metal-oxide semiconductor field-effect transistors) can each be connected in parallel with one of the bypass diodes 122, 124, 126, 128 and to one of the groups of solar cells 112, 114, 116, 118. For instance, the first bypass switch 142 is connected in parallel with the first bypass switch 122 and the first group of solar cells 112.

For the sake of clarity, the next few paragraphs will describe only the first bypass switch 142, the first bypass diode 122, and the first group of solar cells 112. The bypass switch 142 can be normally in an open (or off) state when the group of solar cells 112 operates normally. When the group of solar cells 112 becomes too resistive, and current passes through the bypass diode 122, the bypass switch 142 can be closed (or turned on) so that a majority of the current passes through the bypass switch 142 rather than through the bypass diode 122. The bypass switch 142 can be configured to allow the current through the bypass diode 122, also known as a bypass current, to pass through the bypass switch 142 rather than the bypass diode 122 or the group of solar cells 112. Bypass current is current that passes through a bypass diode 122, 124, 126, 128 or a bypass switch 142, 144, 146, 148 rather than a group of solar cells 112, 114, 116, 118. In an embodiment, the bypass switch 142 is configured to turn on and off periodically. Thus, when the bypass switch 142 is off (open), bypass current primarily passes through the bypass diode 122. When the bypass switch 142 is on (closed), bypass current primarily passes through the bypass switch 142. However, the duty cycle of the bypass switch 142 is such that the bypass current passes through the bypass switch 142 more often than the bypass current passes through the bypass diode 122.

The bypass switches 142, 144, 146, 148 can be any electrical device having low resistance or impedance when in a closed state (the on state) and high impedance in an open state (the closed state). For instance, in an embodiment, the bypass switches 142, 144, 146, 148 are transistors. In an embodiment, the bypass switches 142, 144, 146, 148 are metal-oxide semiconductor field-effect transistors (MOSFETs), although other types of electrical switches can also be implemented. Because of the low impedance of the bypass switches 142, 144, 146, 148, there is little voltage drop or heat generated when the bypass current passes through the bypass switches 142, 144, 146, 148. The bypass switches 142, 144, 146, 148 ideally pass most of the bypass current so that the bypass diodes do not generate heat and waste power. This also prevents damage to the bypass diodes 122, 124, 126, 128. While the bypass switches 142, 144, 146, 148 are illustrated as enhancement mode n-type MOSFETs, it should be understood that any type of switch having a low-loss (or low impedance) on state can be used.

Each bypass diode 122, 124, 126, 128 can have a positive and a negative terminal. When forward biased, there is a voltage drop from the negative terminal to the positive terminal. In other words, current passes through the bypass diodes 122, 124, 126, 128 from each bypass diode's negative terminal to each bypass diode's positive terminal.

In an embodiment, the bypass diodes 122, 124, 126, 128 and the bypass switches 142, 144, 146, 148 are in a junction box 110. A junction box is a container in which electrical connections are made that protects living entities from contact with the connections. The junction box can include a bypass circuit 140. The bypass circuit includes the bypass switches 142, 144, 146, 148 and a controller 150.

The controller 150 can be configured to turn the bypass switches 142, 144, 146, 148 on and off. In an embodiment, the controller 150 periodically turns the bypass switches 142, 144, 146 on and off. In an embodiment, the controller 150 can control duty cycles of the bypass switches 142, 144, 146, 148. The controller 150 can send electrical signals or pulses to the bypass switches 142, 144, 146, 148 to control when the bypass switches 142, 144, 146, 148 open and close. If the bypass switches 142, 144, 146, 148 are field-effect transistors, then the controller 150 can control the bypass switches 142, 144, 146, 148 through gates of the field-effect transistors. If the bypass switches 142, 144, 146, 148 are bipolar junction transistors, then the controller 150 can control the bypass switches 142, 144, 146, 148 through the bases of the bipolar junction transistors.

In an embodiment, the control 150 can hold one or more of the bypass switches 142, 144, 146, 148 on (closed) for a period of time, then turn the one or more of the bypass switches 142, 144, 146, 148 off (open), then turn the one or more bypass switches 142, 144, 146, 148 back on when the bypass current passes through one of the bypass diodes 122, 124, 126, 128. For instance, if a leaf falls onto the solar module 102 and blocks light from reaching the first group of solar cells 112, bypass current will pass through the first bypass diode 122. The controller 150 may sense the bypass current in the first bypass diode 122 and turn the first bypass switch 142 on. The leaf may then blow away allowing current to pass through the first group of solar cells 112 rather than through the first bypass diode 122 or the first bypass switch 142. The controller 150 may hold the first bypass switch 142 on for a period of time even though bypass current is no longer passing through the first bypass diode 122 or the first bypass switch 142. The controller 150 may then turn the first bypass switch 142 off after a period of time. Later, the first group of solar cells 112 may again become shadowed or malfunction and cause bypass current to again pass through the first bypass diode 122. The controller 150, sensing the bypass current in the first bypass diode 122, can turn the first bypass switch 142 back on allowing the bypass current to pass through the first bypass switch 142 rather than the first bypass diode 122.

The controller 150 can monitor or measure current and voltage drop. The controller 150 can monitor voltage across each bypass diode 122, 124, 126, 128. The controller 150 can monitor temperature in the junction box 110. The controller 150 can turn one or more of the bypass switches 142, 144, 146, 148 on when the temperature in the junction box 110 exceeds a predefined temperature. The controller 150 can turn one of the bypass switches 142, 144, 146, 148 on when a voltage across one of the bypass diodes 122, 124, 126, 128 exceeds a predefined voltage. For instance, when the voltage across the first bypass diode 122 exceeds a predefined voltage, the controller 150 can turn the first bypass switch 142 on, allowing current to pass through the first bypass switch 142 and causing the voltage across the first bypass diode 122 to drop below the predefined voltage. In an embodiment, the controller 150 can be powered via controller power connections 160, 162 enabling current to be drawn from the bypass current and/or the solar module 102.

One skilled in the art will recognize that the illustrated embodiment is illustrative only. The number of elements and/or components used is meant only to illustrate and is not to be taken as limiting. For instance, instead of four groups of solar cells 112, 114, 116, 118, each with a bypass diode 122, 124, 126, 128 and a bypass switch 142, 144, 146, 148 connected in parallel, there could be two, three, five or any number of groups of solar cells 112, 114, 116, 118 along with their respective bypass diodes 122, 124, 126, 128 and bypass switches 142, 144, 146, 148. There can also be more than one bypass diode 122, 124, 126, 128 for each group of solar cells 112, 114, 116, 118. There can be more than one bypass switch 142, 144, 146, 148 for each group of solar cells 112, 114, 116, 118. There can also be systems where one bypass switch 142, 144, 146, 148 is connected in parallel with more than one group of solar cells 112, 114, 116, 118 and more than one bypass diode 122, 124, 126, 128.

Figure 5:
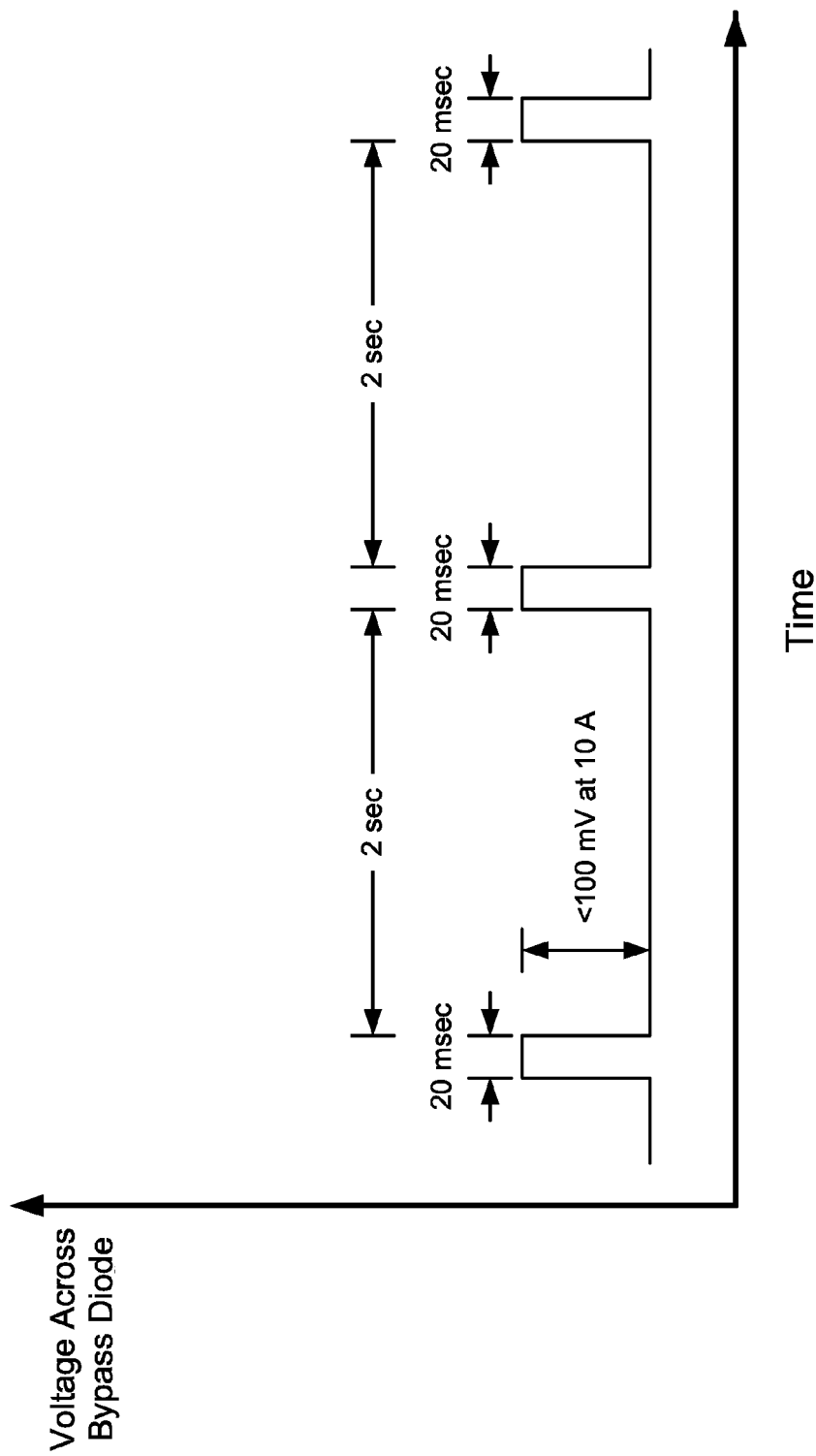
FIG. 5 illustrates a timing chart for the voltage through any one of the bypass diodes illustrated in FIG. 1.

FIG. 5 illustrates a timing chart for the voltage through any one of the bypass diodes illustrated in FIG. 1. The switches are turned on for two second intervals and turned off for twenty millisecond intervals. In other words, current passes through the bypass switches for a time that is one hundred times as great as the time that current passes through the bypass diodes. When the bypass switches are on, the voltage across the bypass diodes drops by less than one hundred millivolts (assuming a ten amp current). This low voltage drop keeps heat dissipation in the junction box low.

Figure 2A:
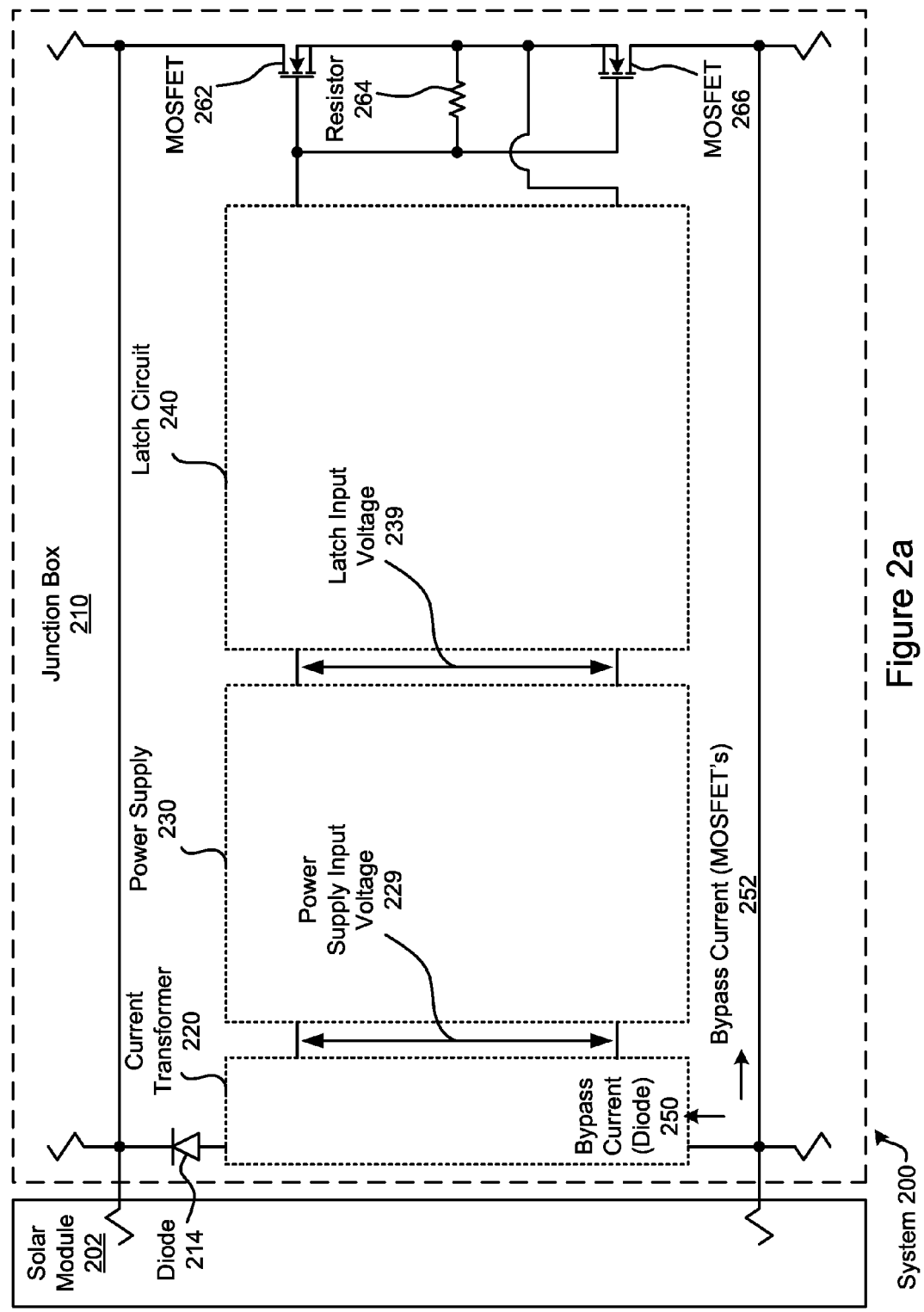
FIG. 2a illustrates an embodiment of a pair of bi-directional bypass switches obtaining power from current passing through a bypass diode.
Figure 2B:
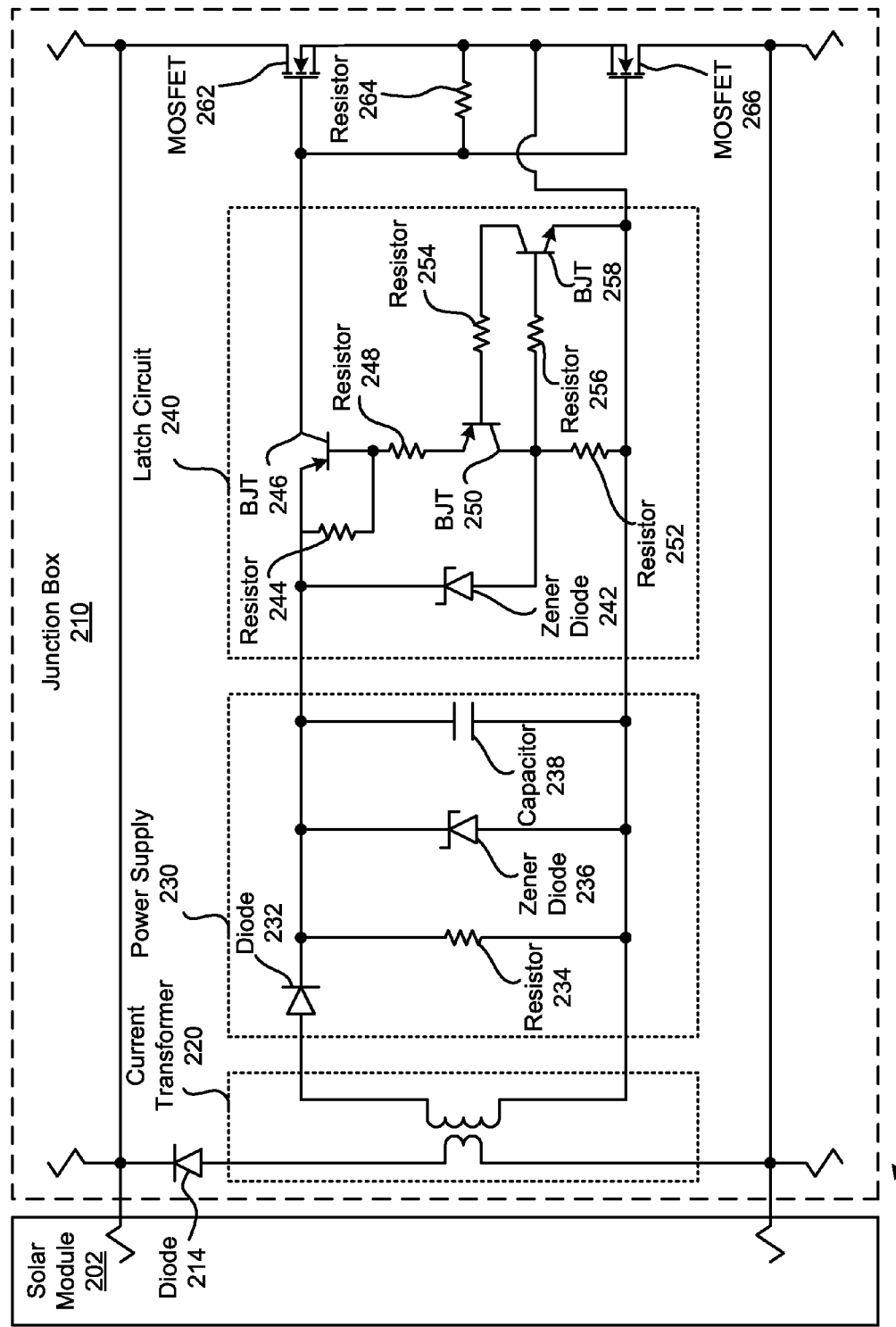
FIG. 2b illustrates embodiments of a current transformer, a power supply, and a latch circuit.
Figure 3:
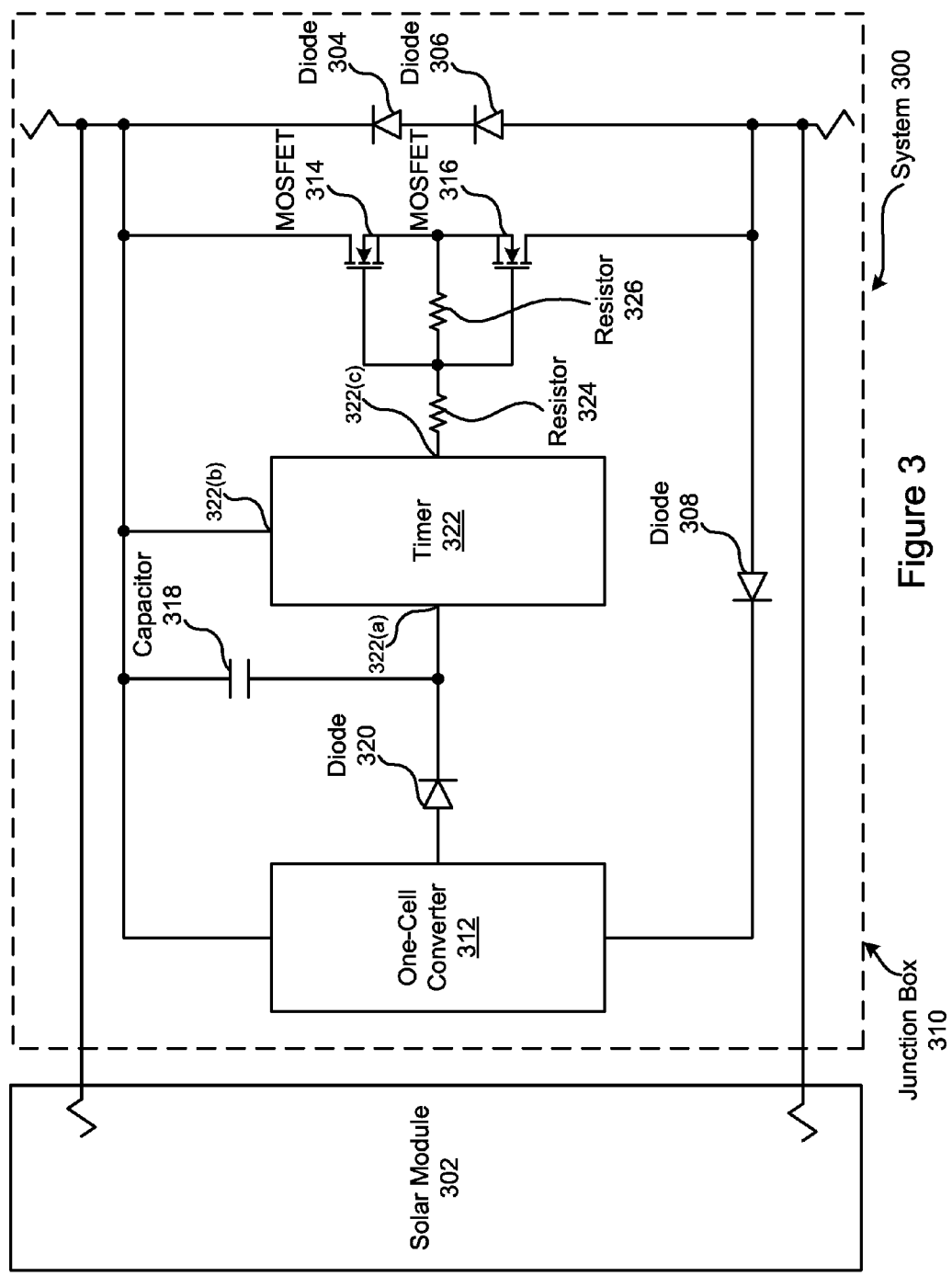
FIG. 3 illustrates an embodiment of a pair of bi-directional bypass switches obtaining power from a voltage drop across a pair of bypass diodes.

The bypass switches 142, 144, 146, 148 may need power in order to operate. FIGS. 2a, 2b, and 3 and the following discussion describe embodiments for efficiently obtaining this power. The overall operation of the embodiments in FIGS. 2a, 2b and 3 are the same as the embodiment in FIG. 1: bypass switches are turned on and off in order to allow a portion of the bypass current to bypass one or more groups of solar cells and to bypass one or more bypass diodes and instead pass through bypass switches.

FIG. 2a illustrates an embodiment of a pair of bi-directional bypass switches obtaining power from current passing through a bypass diode. Like the system 100 illustrated in FIG. 1, system 200 includes a solar module 202. The solar module 202 includes two or more groups of solar cells connected in series (not illustrated). Each group of solar cells has a bypass diode connected to it in parallel. Only one bypass diode 214 is illustrated in FIG. 2a in order to simplify the drawing and enable the drawing to focus on the details of powering and controlling the switchable connection, or bypass switch. The six zigzag symbols at the ends of connections or wires indicate connections to wires, circuits, or devices that are not illustrated. These connections are not open or disconnected.

While FIG. 1 showed an embodiment where each bypass diode was connected in parallel with a single bypass switch, FIG. 2a illustrates an embodiment where the bypass diode 214 is connected in parallel with two switchable connections 262, 266. The two illustrated switchable connections 262, 266 are enhancement mode n-type MOSFETs and are thus turned on when a sufficiently high voltage is applied to the gates of the pair of MOSFETs 262, 266. The two switchable connections 262, 266 are bi-directional in order to prevent bypass current passing through an intrinsic diode of the MOSFETs 262, 266 before the MOSFETs 262, 266 are turned on. While the two switchable connections 262, 266 are illustrated as enhancement mode n-type MOSFETs, it should be understood that other types of transistors and other switchable connections can also be used. For the purposes of this non-limiting embodiment, the switchable connections 262, 266 will be referred to as MOSFETs. In an embodiment, a single MOSFET can be implemented.

In order to power the MOSFETs 262, 266 the system 200 can include a current transformer 220, a power supply 230, and a latch circuit 240. The current transformer 220 generates a power supply input voltage 229 when a first bypass current 250 through the bypass diode 214 increases or spikes (e.g., when the MOSFETs 262, 266 turn off). This increase in bypass current 250 through the bypass diode 214 causes the power supply input voltage 229 to increase. This increase charges the power supply 230. As the power supply 230 is charged, the latch input voltage 239 increases. When the latch input voltage 239 rises above a first voltage threshold, the latch circuit 240 is configured to discharge the power supply 230 into a first gate of the first MOSFET 262 and a second gate of the second MOSFET 266. In other words the latch circuit 240 is in the on state and provides a control voltage to the gates of the first and second MOSFETs 262, 266. This turns the first and second MOSFETs 262, 266 on and allows a second bypass current 252 to pass through the MOSFETs 262, 266. At this point, the second bypass current 252 is greater than the first bypass current 250. While the first and second MOSFETs 262, 266 are on and passing the second bypass current 252, the first bypass current 250 through the bypass diode 214 drops to near zero amperes since the bypass diode 214 typically has a higher voltage drop than the combined voltage drop across the first and second MOSFETs 262, 266.

The power supply 230 discharges into the gate terminals of the first and second MOSFETs 262, 266, and the power supply 230 decreases voltage (meaning that the latch input voltage 239 decreases). Once the first and second MOSFETs 262, 266 are on, there is little change in the current through the bypass diode 214, and thus the power supply 230 is not recharged. When the latch input voltage 239 falls below a second voltage threshold, that is lower than the first voltage threshold, the latch circuit 240 is in the off state which causes the first and second MOSFETs 262, 266 to be in the off state. As a result, the second bypass current 252 through the MOSFETs 262, 266 goes to near zero amperes. Instead, bypass current primarily passes through the bypass diode 214. Furthermore, when the first and second MOSFETs 262, 266 turn off, the first bypass current 250 sees a rapid current increase or current spike (voltage across the bypass diode 214 also rapidly increases or spikes). A portion of this current spike is passed through the current transformer 220 to the power supply 230 which recharges the power supply 230. The portion of the current spike charges the power supply 230 until the latch input voltage 239 again exceeds the first voltage threshold. At that point, the first and second MOSFETs 262, 266 are turned back on.

This process periodically turns the first and second MOSFETs 262, 266 on and off with the first and second MOSFETs 262, 266 being on a majority of the time. Only a fraction of time elapses while the MOSFETs 262, 266 are off. Thus, bypass current only passes through the bypass diode 214 for a small fraction of time. Losses from high current passing through the bypass diode 214 and potential damage to the bypass diode 214 can thus be avoided.

The current transformer 220 charges the power supply 230 whenever the first bypass current 250 through the bypass diode 214 increases (a decrease in the first bypass current 250 would cause the current transformer 220 to discharge the power supply 230 except that the power supply is configured to only allow current to pass in a direction that charges the power supply 230, for instance via use of a diode). The latch circuit 240 prevents the power supply 230 from discharging until the power supply 230 reaches a certain voltage. This occurs when the latch input voltage 239 is greater than or exceeds the first voltage threshold. When this happens, the latch circuit 240 allows the power supply 230 to discharge into the gates of the first and second MOSFETs 262, 266. This turns the first and second MOSFETs 262, 266 on. The bypass current begins passing through the first and second MOSFETs 262, 266 instead of through the bypass diode 214. The power supply 230 discharges its voltage into the gates of the first and second MOSFETs 262, 266 until the latch input voltage 239 drops below the second voltage threshold. When this happens, the latch circuit 240 stops passing current, which cuts off current to the gate terminals of the first and second MOSFETs 262, 266. The first and second MOSFETs 262, 266 turn off and the bypass current passes primarily through the bypass diode 214 instead of the first and second MOSFETs 262, 266. When the first and second MOSFETs 262, 266 turn off (switch), a current spike through the bypass diode 214 occurs. This change in current, via the current transformer 220, causes the power supply 230 to recharge and the process begins again. This process is a continuing loop that allows the first and second MOSFETs to be powered from bypass current passing through the bypass diode 214 while only allowing bypass current to pass through the bypass diode 214 for a small percentage of the time.

In other words, the system 200 uses a fraction of the bypass current to power the first and second MOSFETs 262, 266 and keeps bypass current passing through the first and second MOSFETs 262, 266 rather than through the bypass diode 214. When more power is needed, the first and second MOSFETs 262, 266 turn off momentarily to allow more current to be skimmed off the bypass current as the bypass current momentarily passes through the bypass diode 214.

A current transformer is a type of transformer used to measure high currents. Where high currents are too great for direct measurement via measurement tools, a current transformer produces a reduced current that is proportional to the current being measured. The reduced current can be measured by current measuring instruments. Other types of transformers can also be used, however.

In an embodiment, the first MOSFET 262 has a first source terminal, a first drain terminal, and a first gate terminal. The second MOSFET 266 has a second source terminal, a second drain terminal, and a second gate terminal. The second source terminal can be connected to the first source terminal. A resistor 264 can connect the first gate terminal and the second gate terminal to the first source terminal and the second source terminal. In an embodiment, the resistor 264 in combination with the latch circuit 240 can control the periodicity or duty cycle of the first and second MOSFETs 262, 266. In an embodiment, the system 200 includes a junction box 210. The bypass diode 214, the first and second MOSFETs 262, 266, the current transformer 220, the power supply 230, the latch circuit 240, and the resistor 264 can reside within the junction box 210. FIG. 2a illustrates the circuits and devices that allow a bypass current to bypass the bypass diode 214 and one (or more) group(s) of solar cells (not illustrated). It should be understood that other sets of bypass diodes, current transformers, power supplies, latch circuits, resistors, and MOSFETs can be connected at the top and bottom of the illustration in FIG. 2b.

In an embodiment, the first and second MOSFETs 262, 266 can remain on even when the bypass currents 250, 252 stop flowing or approach zero amperes. Instead current returns to flowing primarily through the group of solar cells. In other words, the group of solar cells temporarily ceases to use the bypass diode 214 or the MOSFETs 262, 266—the group of solar cells returns to normal operation. The first and second MOSFETs 262, 266 can be turned off after a preset period of time regardless of the path that current takes through the system 200 (e.g., through the group of solar cells or through the bypass diode 214 or the MOSFETs 262, 266).

FIG. 2b illustrates embodiments of a current transformer, a power supply, and a latch circuit. FIG. 2b is identical to FIG. 2a, except that electronic devices (resistors, a capacitor, diodes, transistors, a transformer, etc.) are shown that, in this embodiment, can be parts of the current transformer 220, the power supply 230, and the latch circuit 240.

The current transformer 220 has a greater number of windings on the secondary winding than on the primary winding. As such, a current is generated in the secondary windings that is smaller than the bypass current traveling through the primary windings and the bypass diode 214. Other types of transformers can also be used as well as any device capable or using a portion of the bypass current through the bypass diode 214 to charge the power supply 230. In other words, the current transformer 220 can be any device capable of generating a power supply input voltage 229 when the first bypass current 250 through the bypass diode 214 changes. When the first and second MOSFETs 262, 266 close, the first bypass current 250 through the bypass diode 214 spikes or rapidly increases. This current spike generates a current in the secondary coils that charges the power supply 230.

In the illustrated embodiment, the power supply 230 includes a diode 232, a resistor 234, a zener diode 236, and a capacitor 238. When the first bypass current through the bypass diode 214 increases (e.g., via a current spike caused by the first and second MOSFETs 262, 266 switching off) the current transformer 220 generates a current and a voltage in its secondary coils. The current and voltage in the secondary coils charge the capacitor 238. This charging continues until the voltage generated by the current transformer 220 equals the voltage drop across the capacitor 238. A negative current and voltage would also be created when the current through the bypass diode 214 decreases, except that the diode 232 prevents a reversal of current or voltage in the power supply 230. In other words, while the bypass current through the bypass diode 214 increases and decreases, the capacitor 238 is only charged, rather than discharged, because the diode 232 rectifies the current from the current transformer 220.

Even before the current transformer 220 is no longer generating enough voltage to charge the capacitor 238, the voltage drop across the capacitor (the latch input voltage 239) will exceed or be greater than a first voltage threshold. When the voltage drop across the capacitor 238 is greater than the first voltage threshold, the latch circuit 240 turns on and allows a control voltage from the capacitor 238 to be applied to the gate terminals of the first and second MOSFETs 262, 266.

In an embodiment, the latch circuit 240 includes the following: a zener diode 242, a first resistor 244, a first bipolar junction transistor (BJT) 246, a second resistor 248, a second BJT 250, a third resistor 252, a fourth resistor 254, a fifth resistor 256, and a third BJT 258. These components can be connected as illustrated in FIG. 2b. Other components can be used to achieve the same functionality: passing current once the latch input voltage 239 exceeds a first voltage threshold and not passing current once the latch input voltage 239 drops below a second voltage threshold. The first voltage threshold is greater than the second voltage threshold. In other words, the latch circuit 240 has a hysteretic operation—it turns on when the latch input voltage 239 rises above a first voltage threshold, but does not turn off until the latch input voltage 239 falls below the second voltage threshold.

The first voltage threshold is determined via the combination of the threshold voltage on the zener diode 242 and the base-emitter threshold voltage of the third BJT 258 (npn). Once the latch circuit input voltage 239 is great enough to turn the third BJT 258 on, the second BJT 250 (pnp) turns on, which in turn turns on the first BJT 246 (pnp). With the first BJT 246 turned on, the capacitor 238 can discharge its voltage into the gates of the first and second MOSFETs 262, 266. The second and third BJT's 250, 258 form a thyristor or bi-stable circuit which latches on once the first voltage threshold is surpassed, and do not latch off until the latch circuit input voltage 239 falls below the second voltage threshold. By modifying the value of the fifth resistor 256, the value of the zener diode 242, and the value of the capacitor 238, a duty cycle of the latch circuit 240 can be modified.

The electronic devices that constitute the current transformer 220, the power supply 230, and the latch circuit 240 are illustrative only. Other electronic devices could also be used and still achieve the same functionality: to use a small portion of the bypass current to power the first and second MOSFETs 262, 266 and thus enable the bypass current to bypass the bypass diode 214 (passing through the first and second MOSFETs 262, 266 instead).

In an embodiment, the switching of the first and second MOSFETs 262, 266 to an off state may not generate a large enough current spike through the bypass diode 214 to cause the latch input voltage 239 to exceed the first voltage threshold. In this situation, an embodiment as illustrated in FIG. 3 and discussed below can be implemented.

FIG. 3 illustrates an embodiment of a pair of bi-directional bypass switches obtaining power from a voltage drop across a pair of bypass diodes 304, 306. The system 300 includes two bypass diodes 304, 306 connected in series. The pair of bypass diodes, in combination, are connected in parallel to a group of solar cells (not illustrated) in a solar module 302. The group of solar cells can be series connected to one or more other groups of solar cells in the solar module 302. The pair of bypass diodes 304, 306 is series connected to one or more other pairs of bypass diodes (not illustrated). The system 300 includes a first diode 308 series connected to a one-cell converter 312. The first diode 308 in combination with a one-cell converter 312 is connected in parallel to the pair of bypass diodes 304, 306 and a first and second MOSFET 314, 316. In an embodiment, the one-cell converter 312 upconverts the voltage drop across the bypass diodes 304, 306 and charges the capacitor 318 using the upconverted voltage. In an embodiment, the one-cell converter 312 is an electronic device for upconverting an input voltage and doing so while powered by one or more cells or batteries. In an embodiment, the one-cell converter 312 can upconvert voltages as low as 0.7 to 0.9 volts. In other words, the one-cell converter 312 can upconvert the voltage drop across the pair of bypass diodes 304, 306 when the voltage drop is greater than or equal to 0.7 volts.

The illustrated MOSFETs 314, 316 are enhancement mode n-type MOSFETs, but p-type, depletion mode, and other transistors can also be used. Current generally passes through the group of solar cells, but when one or more of the solar cells malfunctions, is shaded, or becomes highly resistive for some other reason, the current instead passes through the bypass diodes 304, 306 or through the first and second MOSFETs 314, 316. When the current bypasses the group of solar cells, the current can be referred to as a bypass current. The one-cell converter 312 takes a portion of the voltage drop across the bypass diodes 304, 306, caused by the bypass current, and upconverts the voltage in order to charge the capacitor 318. In other words, just as the embodiments illustrated in FIGS. 2a and 2b use bypass current in the bypass diode to turn the MOSFETs on, the embodiment in FIG. 3 uses the voltage drop across the bypass diodes 304, 306 to turn the MOSFETs 314, 316 on. Another way of saying this is that FIGS. 2a, 2b, and 3 use either the current or voltage in one or more bypass diodes, to trigger the switching of MOSFETs in order to reroute bypass current to the MOSFETs shortly after bypass current begins passing through the one or more bypass diodes.

In an embodiment, the capacitor 318 is charged while the timer 322 is in an off state, and discharges its voltage into the gates of the MOSFETs 314, 316 when the timer 322 is in an on state. In other words, in the on state, the timer 322 connects a higher voltage portion of the capacitor 318 to the gates of the MOSFETs 314, 316. In the off state, the timer 322 prevents or stops a connection between the high voltage portion of the capacitor 318 and the gates of the MOSFETs 314, 316. In an embodiment, the capacitor 318 is configured to turn the MOSFETs 314, 316 on when the timer 322 allows a control signal from the capacitor 318 to reach the MOSFETs 314, 316. In an embodiment, the timer 322 can remain on for a predetermined time. In an embodiment, the timer 322 can turn the MOSFETs 314, 316 off when the direction of bypass current through the MOSFETs 314, 316 reverses. This can be done, for instance via a comparator configured to measure voltages across the MOSFETs 314, 316 to determine when the direction of the bypass current has switched. Prematurely turning the MOSFETs 314, 316 off in this fashion causes a negligible loss of energy since each switching cycle is short (e.g., on the order of a few seconds). In an embodiment, the timer 322 can remain off for a predetermined time. As such, the capacitor 318 can charge to a high enough voltage that when the timer 322 turns on, the capacitor 318 voltage will be large enough to drive the MOSFETs 314, 316 on for a time that is larger than the time that the MOSFETs 314, 316 were off. In an embodiment, the capacitor 318 is not charged when the one or more bypass diodes 304, 306 are not sufficiently forward biased to allow a bypass current to pass through the one or more bypass diodes 304, 306.

In an embodiment, after the capacitor 318 charges for a time in which the timer 322 is off, the timer 322 is configured to turn on for a duration shorter than a time that it takes the capacitor voltage to drop below a threshold voltage of the MOSFETs 314, 316. The threshold voltage of the MOSFETs 314, 316 is a minimum voltage applied to the MOSFET 314, 316 gates to turn the MOSFETs on. The timer 322 achieves a similar goal to the latch circuit illustrated in FIGS. 2a and 2b: it ensures that the capacitor 318 is disconnected from the MOSFET 314, 316 gates long enough to allow the capacitor 318 to recharge such that the capacitor 318 has sufficient voltage to drive the MOSFETs 314, 316 on once the timer 322 goes into the on state. The sufficient voltage can be a minimum voltage that must be applied to the MOSFET 314, 316 gates to put the MOSFETs 314, 316 into the on state; in other words, a voltage threshold of the MOSFETs. In an embodiment, the sufficient voltage is large enough that the capacitor 318 voltage remains above the voltage threshold of the MOSFETs 314, 316 for a period of time. If the capacitor 318 is not allowed to sufficiently charge, then the capacitor 318 voltage may quickly decrease to below the voltage threshold of the MOSFETs 314, 316 thus driving them into the off state faster than desired. The timer 322 prevents this unstable state by ensuring that the MOSFETs 314, 316 remain off long enough to allow the capacitor 318 to sufficiently charge.

In an embodiment, the duty cycle of the timer 322 can be controlled by a fixed clock. The fixed clock can be a part of the timer 322. In this embodiment, the duty cycle of the timer 322 is unaffected by voltages and currents outside of the timer 322 or voltages and currents reaching the timer 322. The fixed clock is solely responsible for controlling the timer's 322 duty cycle. In an embodiment, the timer 322 operates as a three-way switch controlled by a timing circuit and running according to a fixed clock.

In an embodiment, the duty cycle of the timer 322 can be controlled by a trigger of the timer 322. The trigger starts the timer or the timing cycle of the timer. When triggered, the timer 322 either allows voltage to pass from the capacitor 318 to the gates of the MOSFETs 314, 316 for a period of time, or stops voltage from passing from the capacitor 318 to the gates of the MOSFETs 314, 316 for a period of time. In an embodiment, the trigger can have two voltage thresholds. When the first voltage threshold is surpassed, the timer 322 is triggered and turns on. Thus, when the first voltage threshold is surpassed, voltage from the capacitor 318 discharges into the gates of the MOSFETs 314, 316. As the capacitor 318 discharges voltage, a voltage across the capacitor 318 decreases. Eventually, the voltage across the capacitor 318 falls below a second voltage threshold, and the trigger turns the timer 322 off, thus preventing the capacitor 318 from discharging voltage into the gates of the MOSFETs 314, 316. While the timer 322 is off, the bypass current passes through the bypass diodes 304, 306, is upconverted by the one-cell converter 312, and charges the capacitor 318.

To ensure that the voltage across the capacitor 318 is large enough to drive the MOSFETs 314, 316 on, the first and second voltage thresholds can be greater than a voltage threshold of the MOSFETs 314, 316. The voltage threshold of the MOSFETs 314, 316 can be a minimum voltage applied to the MOSFET 314, 316 gates, that that puts the MOSFETs 314, 316 into an on state. In an embodiment, the first voltage threshold is greater than the second voltage threshold. As such, the trigger has a response to the capacitor 318 voltage that can be described as a hysteresis. In an embodiment, the timer 322 can include a Schmidt trigger.

In the illustrated embodiment, the timer 322 has a first terminal 322(a), a second terminal 322(b), and a third terminal 322(c) (although other configurations and numbers of terminals can also be implemented). In an embodiment, the first terminal 322(a) can be at a higher voltage than the second terminal 322(b). For instance, the first terminal 322(a) can be connected to a higher voltage portion of the capacitor 318 (in FIG. 3, the bottom of capacitor 318), and the second terminal 322(b) can be connected to an electrical node that is connected to a lower voltage portion of the capacitor 318 (in FIG. 3, the top of capacitor 318). The first terminal 322(a) can be connected to the capacitor 318 such that the capacitor 318 can discharge voltage into the first terminal 322(a) of the timer 322. When turned on, the timer 322 can connect the first terminal 322(a) to the third terminal 322(c) thus enabling the capacitor 318 to discharge into the gates of the MOSFETs 314, 316. In an embodiment the capacitor 318 voltage passing through the timer 322 from the first terminal 322(a) to the third terminal 322(c) can be acted upon by circuitry within the timer 322 that either upconverts, downconverts, or delays the capacitor 318 voltage.

When voltage is able to pass from the first terminal 322(a) to the third terminal 322(b), the timer 322 is in an on state. When voltage is unable to pass from the first terminal 322(a) to the third terminal 322(b), the timer 322 is in an off state. In an embodiment, the third terminal 322(c) is connected to the second terminal 322(b) when the timer 322 is in the off state, although this configuration is not required. The off state includes any configuration of internal circuitry in the timer 322 wherein voltage does not pass from the first terminal 322(a) to the third terminal 322(c).

In an embodiment, the timer 322 is only sometimes in control of when the capacitor 318 can discharge. For instance, the capacitor 318 can discharge before the timer 322 is ready to turn the MOSFETs 314, 316 off. In other words, the capacitor voltage 318 is too small to turn the MOSFETs 314, 316 on even when the timer 322 allows this voltage through to the gates of the MOSFETs 314, 316. Hence, the duty cycle of the MOSFETs 314, 316 is not entirely controlled by the timer 322. In an embodiment, the timer 322 in combination with the first and second resistors 324, 326 can control the duty cycle of the MOSFETs 314, 316. The timer 322 includes circuitry that periodically allows voltage to pass from the capacitor 318 to the first and second MOSFETs 314, 316. The circuitry of the timer 322 can be controlled by a timing circuit. The timer 322 can control the duty cycle of the first and second MOSFETs 314, 316. In an embodiment, the timer 322 can delay the switching on of the MOSFETs 314, 316 past a time when the capacitor 318 has enough voltage to turn the MOSFETs 314, 316 on. In other words, the timer 322 does not allow the capacitor 318 to discharge voltage into the gates of the MOSFETs 314, 316 until a finite time after the capacitor 318 has sufficient voltage to turn the MOSFETs 314, 316 on. By implementing such a delay in the timer 322, the capacitor 318 can be charged to a voltage above the threshold required to turn the MOSFETs 314, 316 on. Thus, the MOSFETs 314, 316 will not turn back off as soon as the capacitor 318 begins to discharge. Instead, the timer 322 delay can allow the capacitor 318 to charge to a point where it can discharge for a period of time before the voltage across the capacitor 318 is too low to keep the MOSFETs 314, 316 on. In an embodiment, the timer 322 opens the connection between the capacitor and the MOSFETs 314, 316 before the voltage across the capacitor 318 can fall below the threshold required to turn the MOSFETs 314, 316 on.

When the first and second MOSFETs 314, 316 turn on (or are closed), the bypass current passes through the source and drain of the first and second MOSFETs 314, 316. When the first and second MOSFETs 314, 316 turn off (are open), the bypass current passes through the pair of bypass diodes 304, 306. By configuring the timer 322 to be open—connect the capacitor to the gate terminals of the MOSFETs 314, 316—significantly more often than the timer 322 is closed, the bypass current passes through the first and second MOSFETs 314, 316 most of the time. In this way, the voltage drop across the bypass diodes 304, 306 can be reduced. For instance, in an embodiment, the voltage drop across the bypass diodes 304, 306 can be maintained under 100 mV. Bypass current passes through the bypass diodes 304, 306 for short periods of time and only for long enough to keep the capacitor 318 sufficiently charged. Sufficiently charged means having enough voltage to drive the first and second MOSFETs 314, 316 on (closed) when the timer 322 is open.

The system 300 can also include a first resistor 324 connected between the timer 322 and the gate terminals of the first and second MOSFETs 314, 316. The system 300 can also include a second resistor 326 connected between the gate terminals of the first and second MOSFETs 314, 316 and the source terminals of the first and second MOSFETs 314, 316. In an embodiment, the above-described circuitry, aside from the solar module 302, can be enclosed in a junction box 310.

In an embodiment, rather than using a timer 322, the system 300 can periodically turn the first and second MOSFETs 314, 316 off whenever the voltage across the capacitor 318 becomes too low to turn the MOSFETs 314, 316 on or when voltage shows current reversal. While the MOSFETs 314, 316 are off, the bypass current passes primarily through the bypass diodes 304, 306 causing a sufficient voltage drop that the one-cell converter can recharge the capacitor 318. When this happens, the MOSFETs 314, 316 turn back on and the process continues to cycle. In an embodiment, a latch circuit, similar to that described with reference to FIGS. 2a and 2b, can replace the timer 322. The capacitor 318 provides a control voltage to the gates of the first and second MOSFETs 314, 316 when the voltage across the capacitor 318 exceeds a first voltage threshold. The capacitor 318 continues to provide the control voltage to the gates of the first and second MOSFETs 314, 316 while the voltage across the capacitor 318 decreases. When the voltage across the capacitor falls below a second voltage threshold, the latch circuit turns off and the first and second MOSFETs 314, 316 turn off.

Although two bypass diodes 304, 306 are shown, a single bypass diode can also be implemented if that bypass diode has a voltage drop that is large enough to provide the one-cell converter 312 with sufficient voltage to operate. The sufficient voltage is the voltage needed to drive the one-cell converter 312. In an embodiment, the sufficient voltage can be 0.7 volts. In an embodiment, the one-cell converter 312 operates when a sufficient voltage is provided from the bypass current. Thus, a sum of a first voltage across the first bypass diode 304 and a second voltage across the second bypass diode 306 minus a third voltage across the first diode 308 is greater than the sufficient voltage. For example, if the sufficient voltage is 0.7 volts and the first diode 308 drops 0.7 volts, then, the first bypass diode 304 and the second bypass diode 306 must drop at least 1.4 volts or else the one-cell converter 312 will not have enough voltage to operate. In an embodiment, the first diode 308 has a voltage drop of less than 0.7 volts. In other words, the first diode 308 can be a low loss diode such as a reverse biased Schottky diode.

In an embodiment, the first bypass diode 304 includes a positive terminal and a negative terminal. The first bypass diode 304 is forward biased when current passes from the negative terminal to the positive terminal. The second bypass diode 306 includes a positive terminal and a negative terminal. The positive terminal of the second bypass diode 306 is connected to the negative terminal of the first bypass diode. The first bypass diode 304 and the second bypass diode 306 are in parallel with a group of series-connected solar cells. The first MOSFET 314 can be any type of transistor and can therefore also be called the first transistor 314. The second MOSFET 316 can be any type of transistor and can therefore also be called the second transistor 316. The drain terminal of the first transistor 314 is connected to the positive terminal of the first bypass diode 304. The drain terminal of the second transistor 316 is connected to the negative terminal of the second bypass diode 306. The source terminal of the second transistor 316 is connected to the source terminal of the first transistor 314. The negative terminal of the first diode 308 is connected to the negative terminal of the second bypass diode 306, and connected to the drain terminal of the second transistor 316. The one-cell converter 312 has a first terminal, a second terminal, and a third terminal. The first terminal of the one-cell converter 312 is connected to the drain terminal of the first transistor 314, and the positive terminal of the first bypass diode 304. The second terminal of the one-cell converter 314 is connected to the positive terminal of the first diode 308. The second diode 320 has a positive terminal and a negative terminal. The negative terminal of the second diode 320 is connected to the second terminal of the one-cell converter 312. The capacitor 318 has a first terminal and a second terminal. The first terminal of the capacitor 318 is connected to the first terminal of the one-cell converter 312, the drain terminal of the first transistor 314, and the positive terminal of the first bypass diode 304. The second terminal of the capacitor 318 is connected to the positive terminal of the second diode 320.

The timer 322 has a first terminal 322(a), a second terminal 322(b), and a third terminal 322(c). The second terminal 322(b) of the timer 322 can be connected to the first terminal of the one-cell converter 312, the first terminal of the capacitor 318, the drain terminal of the first transistor 314, and the positive terminal of the first bypass diode 304. The third terminal 322(c) of the timer 322 can be connected to the positive terminal of the second diode 320 and the second terminal of the capacitor 318. The timer 322 can control the duty cycle of the first and second transistors 314, 316. The first resistor 324 and the second resistor 326 in combination with the timer 322 can control the duty cycle of the first and second transistors 314, 316. The first resistor 324 can have a positive terminal connected to the gate terminal of the first transistor 314 and the gate terminal of the second transistor 316. The first resistor 324 can have a negative terminal connected to the first terminal 322(a) of the timer 322. The second resistor 326 can have a positive terminal connected to the source terminal of the first transistor 314, and the source terminal of the second transistor 316. The negative terminal of the second resistor 326 can be connected to the positive terminal of the first resistor 324, the gate terminal of the first transistor 314, and the gate terminal of the second transistor 316.

Figure 4:
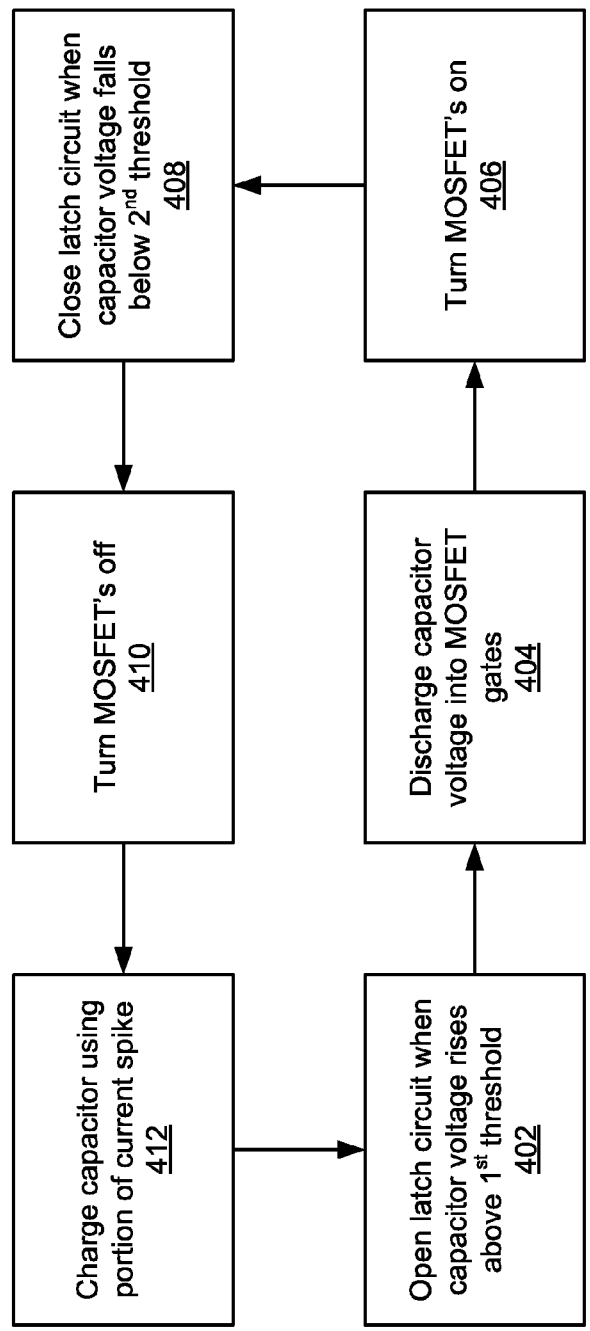
FIG. 4 illustrates an embodiment of a method for bypassing bypass diodes in a solar energy generating system.

FIG. 4 illustrates an embodiment of a method 400 for bypassing bypass diodes in a solar energy generating system. The method 400 includes an open latch circuit operation 402 for opening a latch circuit of a controller when a voltage across a capacitor of the controller exceeds a first voltage threshold. The method also includes a discharge capacitor voltage into MOSFETs operation 404 for discharging a portion of the voltage into a pair of bi-directional MOSFETs connected at their sources and controlled by the controller. The method 400 also includes a turn MOSFETs on operation 406 for turning the bi-directional MOSFETs on. The method 400 also includes a close latch circuit when capacitor voltage falls below a second voltage threshold operation 408 for closing the latch circuit when the voltage across the capacitor falls below a second voltage threshold. The second voltage threshold is less than the first voltage threshold. The method 400 also includes a turn MOSFETs off operation 410 for turning the bi-directional MOSFETs off. This in turn generates a current and voltage spike through the bypass diode. The method 400 also includes a charge capacitor using a portion of the current spike operation 412 for charging the capacitor using a portion of the current spike.

The open latch circuit operation 402 opens a latch circuit of a controller when a voltage across a capacitor of the controller exceeds a first voltage threshold. The latch circuit is a switch that turns on or passes current when an input voltage to the latch circuit is greater than or increases above a first voltage threshold and turns off when the input voltage to the latch circuit is less than or decreases below a second voltage threshold. The first voltage threshold can be greater than the second voltage threshold. As a result, the latch circuit has a hysteretic operation: as the voltage across the capacitor increases it can surpass the first voltage threshold and turn the latch circuit on. The input voltage to the latch circuit is the same as the voltage across the capacitor. With the latch circuit on, the capacitor can discharge voltage and current through the open latch circuit. This decreases the voltage across the capacitor. However, the latch circuit remains in an open state even as the voltage across the capacitor (or the input voltage to the latch circuit) decreases below the first voltage threshold. The voltage across the capacitor continues to decrease until it falls below the second voltage threshold. Then the latch circuit closes (or turns off). The capacitor voltage is a voltage across the capacitor. The first voltage threshold is a voltage that must be surpassed in order for the latch circuit to turn on. The latch circuit turns off when the input voltage to the latch circuit falls below the second voltage threshold. The latch circuit can be part of a controller. The controller can be responsible for controlling when the MOSFETs open and close. In other words, the controller determines when bypass current passes primarily through the bypass diode and when the bypass current passes primarily through the bypass switches.

The discharge capacitor voltage into transistor gate 404 operation can discharge the capacitor voltage into the gate of a transistor. In an embodiment, there can be two transistors and the discharge capacitor voltage into transistor gate 404 operation can discharge the capacitor voltage into the gates of both transistors. In an embodiment, the one or two transistors can be MOSFETs. The one or two transistors can be n-type MOSFETs. The one or two transistors can be enhancement mode MOSFETs. In an embodiment, the one or two MOSFETs can have their sources connected. The voltage discharged into the one or more transistors can be great enough to turn the transistors on—to allow them to pass current. The capacitor voltage decreases as the voltage across the capacitor is discharged through the open latch circuit and into the one or two gates of the one or two transistors.

The discharge capacitor voltage into MOSFETs operation 404 can discharge a portion of the voltage into a pair of bi-directional MOSFETs connected at their sources and controlled by the controller. MOSFETs can pass current even in the off state. In an embodiment, the on state of the MOSFETs is one in which a majority of bypass current passes through the MOSFETs rather than the bypass diode. In an embodiment, the one state of the MOSFETs is one in which an inversion layer has been formed in the MOSFETs and a non-negligible current passes from the source to the drain of each MOSFET. The MOSFETs can turn on when a voltage is applied to their gates and the voltage is above a threshold voltage for the MOSFETs. The MOSFETs turn on via the turn MOSFETs on operation 406.

The voltage across the capacitor eventually falls below a second voltage threshold, where the second voltage threshold is lower than the first voltage threshold. When this happens, the close latch circuit when capacitor voltage falls below a second voltage threshold operation 408 closes the latch circuit thus preventing the capacitor from discharging.

Without the voltage from the capacitor, the MOSFETs turn off or open in the turn MOSFETs off operation 410. In the off state, current generally does not pass through the MOSFETs. However, the switching causes a current and voltage spike through the bypass diode.

A portion of the current or voltage spike can be used to charge the capacitor in the charge capacitor using a portion of the current spike operation 412. This can be done, for instance, via a transformer and associated circuitry configured to pass current to the capacitor when the current through the bypass diode increases. In an embodiment, a current transformer is used. This charging activity takes place after the voltage across the capacitor has fallen below the second voltage threshold. The charging thus raises the voltage across the capacitor above the second voltage threshold. The charging can be sufficient to also raise the capacitor voltage above the first voltage threshold. The latch circuit then opens via the open latch circuit operation 402 and the method 400 continues repeating the operations described above.

It should be understood that while the method 400 has been described with reference to a single bypass diode, two or more bypass diodes connected in series can also be used. It should further be understood that while the description of the method 400 appeared to have a beginning and ending operation, the method 400 is a repeating loop that does not have a start or end operation.

It is clear that many modifications and variations of these embodiments may be made by one skilled in the art without departing from the spirit of the novel art of this disclosure. For example, the latch circuit can use MOSFETs rather than BJT's. As another example, a single bypass MOSFET can be used in many of the disclosed embodiments, rather than a pair of bi-directional MOSFETs. As another example, a timer, as illustrated and discussed in FIG. 3, can control the duty cycle of the MOSFETs 262, 266 in FIG. 2. Similarly, a periodic discharge of the capacitor 318 can determine the duty cycle of the MOSFETs 314, 316 in FIG. 3 if the timer 322 is not used or is not implemented. These modifications and variations do not depart from the broader spirit and scope of the invention, and the examples cited herein are to be regarded in an illustrative rather than a restrictive sense.

What is claimed is:

1. A system, comprising:
    a group of series-connected solar cells in a solar module, wherein
        the solar module has a plurality of groups of solar cells, including the group of series-connected solar cells,
        the plurality of groups are connected in series, and
        solar cells in the group are series-connected between two nodes;
    a bypass diode connected between the two nodes and configured to allow a current generated by the solar module to flow from a first node of the two nodes to a second node of the two nodes via the bypass diode and bypass the group of series-connected solar cells; and
    a bypass switch having a MOSFET separate from the bypass diode and connected between the two nodes and configured to allow a bypass current to flow from the first node to the second node via the bypass switch and bypass:
        the group of solar cells; and
        the bypass diode.

2. The system of claim 1, wherein current passes through the bypass switch more often than current passes through the bypass diode.

3. The system of claim 1, further comprising a current transformer configured to generate a power supply input voltage to a power supply when a current passing through the bypass diode increases.

4. The system of claim 3, wherein the power supply input voltage charges a capacitor of the power supply.

5. The system of claim 4, further comprising a latch circuit configured to:
- discharge the power supply into a first gate terminal and a second gate terminal, when a power supply input voltage is greater than a first voltage threshold; and
- prevent the power supply from discharging into the first gate terminal and the second gate terminal, when the power supply input voltage is less than a second voltage threshold lower than the first voltage threshold;
- wherein the latch circuit provides a control signal to control the bypass switch.

6. The system of claim 1, further comprising a controller for turning the bypass switch on, when the bypass diode, is forward biased.

7. The system of claim 6, wherein the controller turns the bypass switch on based on the bypass current through the bypass diode.

8. The system of claim 6, wherein the controller turns the bypass switch on based on a voltage drop across the bypass diode, wherein the voltage drop is caused by the bypass current passing through the bypass diode.

9. The system of claim 6, wherein the controller periodically turns the bypass switch on and off.

10. The system of claim 6, wherein the controller:
- holds the bypass switch on for a period of time;
- turns the bypass switch off; and
- turns the bypass switch back on when the bypass current passes through the bypass diode.

11. The system of claim 1, further comprising:
- a control circuit coupled with the bypass switch, wherein the control circuit has a power supply;
- a current transformer coupled with the bypass diode and the power supply to charge the power supply using a current passing through the bypass diode; and
- a latch circuit coupled to the power supply to control the bypass switch, wherein when the power supply has sufficient power, the latch circuit is configured to close the bypass switch to allow the bypass current to bypass:
- the group of solar cells; and
- the bypass diode.

\* \* \* \* \*